United States Patent
Gu

(10) Patent No.: US 11,695,421 B1
(45) Date of Patent: Jul. 4, 2023

(54) DELAY-LOCKED LOOP, CONTROL METHOD FOR DELAY-LOCKED LOOP, AND ELECTRONIC DEVICE

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/805,091

(22) Filed: Jun. 2, 2022

Related U.S. Application Data

(63) Continuation of application No. PCT/CN2022/085078, filed on Apr. 2, 2022.

(30) Foreign Application Priority Data

Jan. 14, 2022 (CN) .......................... 202210043659.X

(51) Int. Cl.
*H03L 7/081* (2006.01)
*H03L 7/085* (2006.01)

(52) U.S. Cl.
CPC ............ *H03L 7/0812* (2013.01); *H03L 7/085* (2013.01)

(58) Field of Classification Search
None
See application file for complete search history.

(56) References Cited

U.S. PATENT DOCUMENTS

| | | |
|---|---|---|
| 6,104,251 A | 8/2000 | Ramey et al. |
| 8,704,561 B2 | 4/2014 | Lee et al. |
| 9,041,446 B2 | 5/2015 | Blodgett et al. |
| 10,693,472 B2 | 6/2020 | Kim et al. |
| 11,152,044 B1 * | 10/2021 | Park ..................... H03L 7/0812 |
| 2008/0192563 A1 * | 8/2008 | Cho ..................... G11C 11/4076 |
| | | 365/233.17 |

(Continued)

FOREIGN PATENT DOCUMENTS

| | | |
|---|---|---|
| CN | 102931979 A | 2/2013 |
| CN | 110474633 A | 11/2019 |
| EP | 0766404 A2 | 4/1997 |

OTHER PUBLICATIONS

International Search Report cited in PCT/CN2022/085078 dated Sep. 29, 2022, 10 pages.

*Primary Examiner* — Adam D Houston
(74) *Attorney, Agent, or Firm* — Cooper Legal Group, LLC

(57) ABSTRACT

The present disclosure relates to the technical field of integrated circuits, and specifically to a delay-locked loop, a control method for a delay-locked loop, and an electronic device. The delay-locked loop includes: a secondary path configured to perform frequency division on an input clock signal to generate a frequency-divided clock signal, adjust the frequency-divided clock signal having a first frequency to obtain an output clock signal in a locking process of the delay-locked loop, and adjust the frequency-divided clock signal to make the frequency-divided clock signal have a second frequency when the delay-locked loop is locked in a standby state, wherein the second frequency is lower than the first frequency; and a primary path configured to output, when obtaining a target instruction, an output clock replica signal having a same phase as the output clock signal.

15 Claims, 2 Drawing Sheets

(56) References Cited

U.S. PATENT DOCUMENTS

2015/0043299 A1\* 2/2015 Miyano .................. G11C 7/222
 365/233.13
2015/0043627 A1\* 2/2015 Kang .................... H03L 7/0814
 375/227
2021/0184664 A1\* 6/2021 Weyer ..................... H03L 7/087

\* cited by examiner

US 11,695,421 B1

DELAY-LOCKED LOOP, CONTROL METHOD FOR DELAY-LOCKED LOOP, AND ELECTRONIC DEVICE

CROSS-REFERENCE TO RELATED APPLICATIONS

This is a continuation of International Application No. PCT/CN2022/085078, filed on Apr. 2, 2022, which claims the priority to Chinese Patent Application No. 202210043659.X, titled "DELAY-LOCKED LOOP, CONTROL METHOD FOR DELAY-LOCKED LOOP, AND ELECTRONIC DEVICE" and filed on Jan. 14, 2022. The entire contents of International Application No. PCT/CN2022/085078 and Chinese Patent Application No. 202210043659.X are incorporated herein by reference.

TECHNICAL FIELD

The present disclosure relates to the technical field of integrated circuits, and specifically to a delay-locked loop, a control method for a delay-locked loop, and an electronic device.

BACKGROUND

A delay-locked loop (DLL) is a circuit that performs delay adjustment on a clock signal to implement the synchronization of the clock signal in a system. Since the synchronization does not change with the change of external conditions, such as temperature and voltage, the delay-locked loop is widely used in the field of timing.

However, to ensure the accuracy of data read by a central processing unit (CPU), the existing delay-locked loop is always in a high-frequency state whether it is in a work state or in a standby state, resulting in a higher power consumption of the delay-locked loop.

It should be noted that the information disclosed above is merely intended to facilitate a better understanding of the background of the present disclosure, and therefore may include information that does not constitute the prior art known to those of ordinary skill in the art.

SUMMARY

Other features and advantages of the present disclosure will become more apparent based on the following detailed description, or partially obtained through practice of the present disclosure.

A delay-locked loop is provided according to a first aspect of the present disclosure, and includes: a secondary path configured to perform frequency division on an input clock signal to generate a frequency-divided clock signal, adjust the frequency-divided clock signal having a first frequency to obtain an output clock signal in a locking process of the delay-locked loop, and adjust the frequency-divided clock signal to make the frequency-divided clock signal have a second frequency when the delay-locked loop is locked in a standby state, wherein the second frequency is lower than the first frequency; and a primary path configured to output, when obtaining a target instruction, an output clock replica signal having a same phase as the output clock signal.

A control method for a delay-locked loop is provided according to one aspect of the present disclosure. The delay-locked loop includes a primary path and a secondary path.

The control method includes: performing frequency division on an input clock signal to generate a frequency-divided clock signal; adjusting the frequency-divided clock signal having a first frequency to obtain an output clock signal in a locking process of the delay-locked loop; adjusting the frequency-divided clock signal to make the frequency-divided clock signal have a second frequency when the delay-locked loop is locked in a standby state, wherein the second frequency is lower than the first frequency; and controlling the primary path to output, when obtaining a target instruction, an output clock replica signal having a same phase as the output clock signal.

An electronic device is provided according to one aspect of the present disclosure, and includes the delay-locked loop.

It should be understood that the above general description and the following detailed description are only exemplary and explanatory, and should not be construed as a limitation to the present disclosure.

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure. Apparently, the drawings in the following description show merely some embodiments of the present disclosure, and those of ordinary skill in the art may still derive other drawings from these drawings without creative efforts.

DETAILED DESCRIPTION

Figure 1:
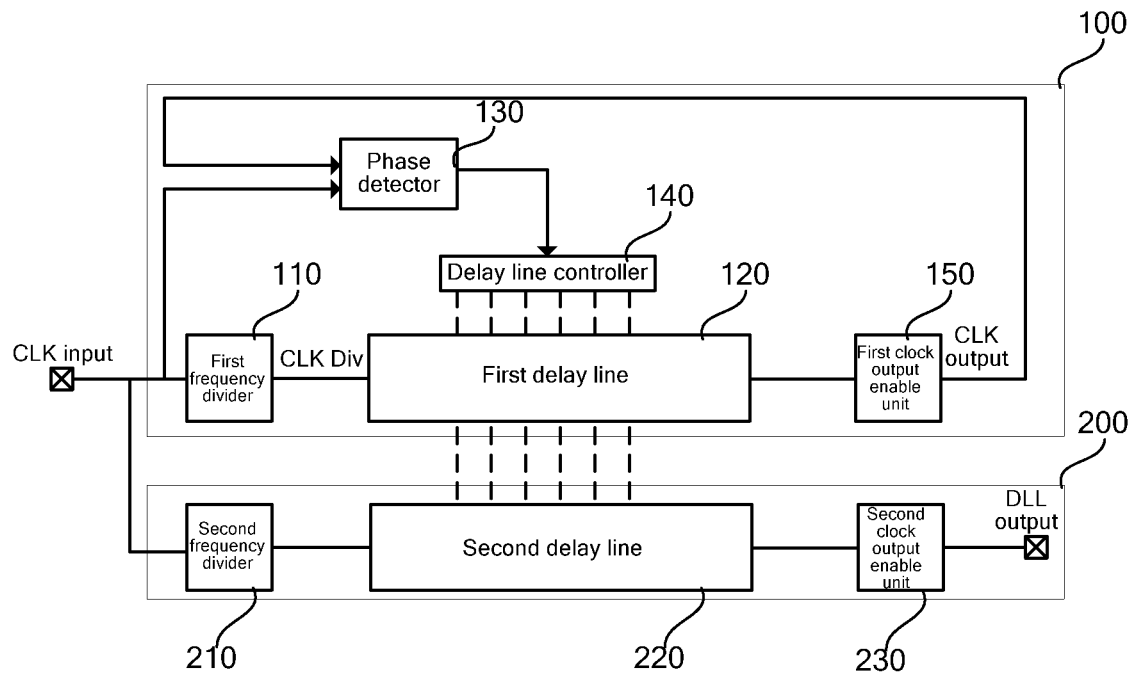
FIG. 1 is a schematic diagram of a circuit of a delay-locked loop according to an implementation of the present disclosure.

Exemplary embodiments will be described below comprehensively with reference to the drawings. The exemplary embodiments may be implemented in various forms, and may not be construed as being limited to those described herein. On the contrary, these exemplary embodiments are provided to make the present disclosure comprehensive and complete and to fully convey the concept manifested therein to those skilled in the art. The same reference numerals in the figures indicate the same or similar parts, and thus their detailed descriptions will be omitted.

The described features, structures, or characteristics may be incorporated into one or more embodiments in any suitable manner. The following description offers many specific details in order for a full understanding of the embodiments of the present disclosure. However, those skilled in the art will be aware that the technical solutions of the present disclosure may be practiced with one or more of the specific details omitted, or other methods, components, apparatuses, steps, and the like may be used. In other cases, well-known structures, methods, apparatuses, implementations, materials, or operations are not shown or described in detail to avoid obscuring aspects of the present disclosure.

The block diagrams shown in the drawings are merely functional entities, which do not necessarily correspond to physically independent entities. That is, these functional entities may be implemented in a form of software, or implemented in one or more hardware modules, or implemented in different networks and/or processor apparatuses and/or microcontroller apparatuses.

As a central processing unit speeds up continuously, memory performance becomes a limiting factor in system performance. An important aspect of improving the memory performance is to accelerate the speed at which data is transmitted into and out of a dynamic random access memory (DRAM). In high-speed DRAM technologies such as a Rambus dynamic random access memory (RDRAM) and a double data rate synchronous dynamic random access memory (DDR SDRAM), a delay-locked loop is a circuit that reduces a phase difference between an input clock and a control signal to the greatest extent.

To ensure the accuracy when the CPU reads data from the DRAM, the delay-locked loop is required to keep working continuously before a read instruction and other instructions are enabled. In view of the above, the power consumption of the delay-locked loop is also a part that cannot be ignored.

On this basis, referring to FIG. 1, one embodiment of the present disclosure provides a schematic diagram of a circuit of a delay-locked loop. In FIG. 1, the delay-locked loop includes a secondary path 100 and a primary path 200. The secondary path 100 is configured to perform frequency division on an input clock signal CLK input to generate a frequency-divided clock signal CLK Div, adjust the frequency-divided clock signal having a first frequency to obtain an output clock signal CLK output in a locking process of the delay-locked loop, and adjust the frequency-divided clock signal CLK Div to make the frequency-divided clock signal CLK Div have a second frequency when the delay-locked loop is locked in a standby state, where the second frequency is lower than the first frequency.

The primary path 200 is configured to output, when obtaining a target instruction, an output clock replica signal DLL output having a same phase as the output clock signal CLK output. For the DRAM, the target instruction may be various control instructions such as a read instruction, a write instruction, and a refresh instruction, and is not specially limited by the exemplary implementation of the present disclosure.

According to the delay-locked loop provided by one embodiment of the present disclosure, the delay-locked loop is divided into the secondary path 100 and the primary path 200. The secondary path 100 adjusts the input clock signal CLK input to obtain the output clock signal CLK output, and the primary path 200 outputs the output clock replica signal DLL output having the same phase as the output clock signal CLK output for subsequent instruction control. Since the secondary path 100 first performs the frequency division on the input clock signal CLK input in a phase adjustment process to generate the frequency-divided clock signal CLK Div, and the frequency-divided clock signal CLK Div has a different frequency in the standby state in the locking process of the delay-locked loop, by using a lower second frequency in the standby state, a standby current of the delay-locked loop can be reduced without influencing the output accuracy of the delay-locked loop when the delay-locked loop is in the standby state, thereby achieving the purpose of reducing the power consumption of the delay-locked loop.

In practical application, the locking process of the delay-locked loop refers to a process in which the delay-locked loop adjusts a phase difference between the input clock signal CLK input and the output clock signal CLK output through a delay line. After a target phase difference is reached through the adjustment, for example, the phase difference is zero, the delay line can be locked, so that the clock signals of a system in subsequent operation can be synchronized. The standby state of the delay-locked loop refers to a state after the delay-locked loop is locked.

It should be noted that the primary path 200 is in an off state no matter in the locking process or the standby state of the delay-locked loop. Only when the target instruction is acquired, the primary path 200 is opened for outputting the output clock replica signal DLL output.

Specifically, in the exemplary implementation of the present disclosure, referring to FIG. 1, the secondary path 100 may include a first frequency divider 110, a first delay line 120, a phase detector 130, and a delay line controller 140.

The first frequency divider 110 may be configured to perform the frequency division on the input clock signal CLK input to generate the frequency-divided clock signal CLK Div. According to actual requirements, the frequency-divided clock signal CLK Div may have different frequencies, such as a first frequency and a second frequency. It should be noted that the embodiments of the present disclosure do not specially limit the specific sizes of the first frequency and the second frequency. Moreover, according to actual situations, the first frequency divider 110 may generate a plurality of frequency-divided clock signals CLK Div having different frequencies, so that a user selects an appropriate frequency as the frequency of the frequency-divided clock signal CLK Div according to requirements.

In the exemplary implementation of the present disclosure, in the locking phase of the delay-locked loop, the frequency-divided clock signal CLK Div has the first frequency; and when the delay-locked loop is locked in the standby state, the frequency-divided clock signal CLK Div has the second frequency.

The first delay line 120 may be configured to perform delay adjustment on the frequency-divided clock signal CLK Div to obtain the output clock signal CLK output having a target phase. During the delay adjustment, since the frequency-divided clock signal CLK Div passing through the first delay line 120 has the first frequency, it can be ensured that the first delay line 120 adjusts the frequency-divided clock signal CLK Div in a high-frequency state, thereby improving the accuracy of delay adjustment.

It should be noted that after the delay-locked loop is locked, or after the first delay line 120 is locked, the first frequency divider 110 can reduce the frequency of the frequency-divided clock signal CLK Div from the first frequency to the second frequency. Therefore, it can be ensured that the first delay line 120 is in a low-frequency state, so as to achieve the purpose of reducing power consumption and saving energy.

In the exemplary implementation of the present disclosure, the phase detector 130 may be configured to obtain the output clock signal CLK output, and compare the output clock signal CLK output with the input clock signal CLK input to determine a phase difference therebetween. Moreover, a control signal can be generated according to the phase difference, and is sent to the delay line controller 140. The delay line controller 140 may be configured to output a corresponding adjustment signal on the basis of the control signal to adjust a delay parameter of the first delay line 120, so that the output clock signal CLK output has a target phase. For example, the output clock signal CLK output and the input clock signal CLK input have a same phase, or there is a specified phase difference between the output clock signal CLK output and the input clock signal CLK input, etc. The target phase is not specially limited in the exemplary implementation of the present disclosure.

In practical application, the first delay line 120 can be adjusted to have a different delay parameter, and the delay parameter refers to a delay time. The means for adjusting the delay time of the first delay line 120 include, but are not limited to, adjusting the length of a delay line and changing the number and specifications of delay devices. The delay line may include a high-resistance line having high resistance and a low-resistance line having low resistance. Adjusting the length of the delay line includes adjusting the length of the high-resistance line and the length of the low-resistance line at the same time, so as to adjust the delay time of the delay line when the total length remains unchanged. The delay parameter is not specially limited in the exemplary implementation of the present disclosure.

In the exemplary implementation of the present disclosure, referring to FIG. 1, the primary path 200 may include a second frequency divider 210 and a second delay line 220.

The second frequency divider 210 has a same inherent delay as the first frequency divider 110, and the inherent delay herein refers to a delay of a device itself. Generally, different devices have different inherent delays, and since the first frequency divider 110 has various devices, to ensure that the inherent delay of the second frequency divider 210 is the same as that of the first frequency divider 110, in the exemplary implementation of the present disclosure, the second frequency divider 210 may be a replica of the first frequency divider 110, and has exactly the same structure as the first frequency divider 110.

It should be noted that in practical application, the second frequency divider 210 may also have a different structure from the first frequency divider 110. For example, the second frequency divider 210 may include multiple delay units, as long as inherent delays of these delay units are ensured to be the same as the inherent delay of the first frequency divider 110, which is not limited in the exemplary implementation of the present disclosure.

In the exemplary implementation of the present disclosure, the second delay line 220 is required to perform the delay adjustment on the frequency-divided clock signal CLK Div by following the first delay line 120 to obtain the output clock replica signal DLL output. That is to say, during the delay adjustment of the secondary path 100, even if the primary path 200 is in an off state of not outputting a signal, the second delay line 220 of the primary path 200 is automatically adjusted with the first delay line 120 and not influenced by the state of the primary path 200 at all.

In practical application, there may be multiple modes that the second delay line 220 performs the delay adjustment on the frequency-divided clock signal CLK Div by following the first delay line 120. The delay line controller 140 controls the second delay line 220 while controlling the first delay line 120. Or, a mode of synchronous control is adopted, and the specific mode of synchronous control is not described again in the exemplary implementation of the present disclosure.

In addition to reducing the power consumption by using the secondary path 100 in a different frequency state, the delay-locked loop provided by one embodiment of the present disclosure also reduces the power consumption by the primary path 200 being in the off state in the locking process of the delay-locked loop and locked in the standby state, thereby achieving the purpose of further reducing the power consumption.

In the exemplary implementation of the present disclosure, the secondary path 100 may further include a first clock output enable unit 150 configured to transmit the output clock signal CLK output to the phase detector 130, so that the phase detector 130 compares the phase of the output clock signal CLK output with the phase of the input clock signal CLK input.

Similarly, the primary path 200 may further include a second clock output enable unit 230 configured to control, when receiving the target instruction, an output terminal of the delay-locked loop to output the output clock replica signal DLL output. That is to say, under the action of the target instruction, the second clock output enable unit 230 is turned on and in an on state, so that the output clock replica signal DLL output can be transmitted.

That is to say, the primary path 200 being in the off state mainly refers to the fact that the second clock output enable unit 230 is in a non-enable state when the target instruction is not received, so that the output clock replica signal DLL output is not outputted.

In practical application, the structure of the second clock output enable unit 230 can be determined according to actual situations. For example, the second clock output enable unit 230 may be a flip-flop or the like, which is configured to output the output clock replica signal DLL output under the triggering of the target instruction. The structure of the second clock output enable unit 230 is not specially limited in the exemplary implementation of the present disclosure.

It should be noted that an inherent delay of the first clock output enable unit 150 may be the same as that of the second clock output enable unit 230. As an example, the structure of the first clock output enable unit 150 may be the same as that of the second clock output enable unit 230, but the difference is that the first clock output enable unit 150 needs to be continuously turned on, without the triggering of the target instruction.

In the exemplary implementation of the present disclosure, the first frequency divider 110 may have a different structure according to a required divided frequency. As an example, referring to FIG. 2, the first frequency divider 110 may include a frequency division unit 111, a delay unit 112, a first multiplexer 113, and a logical AND gate 114.

The frequency division unit 111 may be configured to perform frequency division processing on the input clock signal CLK input to obtain frequency-divided clock signals CLK Div having different frequencies.

The delay unit 112 may be configured to compensate for a delay of the frequency division unit 111, so as to choose not to perform the frequency division by the frequency division unit 111 when a user does not expect to perform the frequency division.

The first multiplexer 113 is provided with an input terminal configured to access an output terminal of the frequency division unit 111 and an output terminal of the delay unit 112, and a control terminal configured to access an output terminal of the logical AND gate 114 of a logic circuit, and is configured to choose to output an output signal of the frequency division unit 111 or an output signal of the delay unit 112 under the control of an output result of the logical AND gate 114.

In addition, the logical AND gate 114 is provided with an input terminal to access a delay-locked loop locking signal DLL_LOCK Flag and a first test signal Testmodel, and is configured to control the first multiplexer 113 to output the output signal of the delay unit 112 when the delay-locked loop locking signal DLL_LOCK Flag and the first test signal Testmodel are enabled at the same time. For example, in the case of high-frequency enable, if the delay-locked loop locking signal DLL_LOCK Flag and the first test signal Testmodel are both at a high level, the first multiplexer 113 selects to output the output signal of the delay unit 112, and does not perform the frequency division processing on the input clock signal CLK input, so that the frequency-divided clock signal CLK Div outputted by the delay-locked loop is always in the same frequency state, that is, at a higher first frequency.

However, when the first test signal Testmodel is not enabled, for example, in the case of a low level, the output signal of the logical AND gate 114 controls the first multiplexer 113 to select to output the output signal of the frequency division unit 111, so as to achieve the purpose of performing the frequency division processing on the input clock signal CLK input.

In practical application, different frequency division units 111 can be provided according to actual situations, as long as the frequency-divided clock signal CLK Div having a required frequency can be obtained. In the exemplary implementation of the present disclosure, the frequency division unit 111 includes a plurality of flip-flops 1111 sequentially connected in series, and a plurality of second multiplexers 1112.

Figure 2:
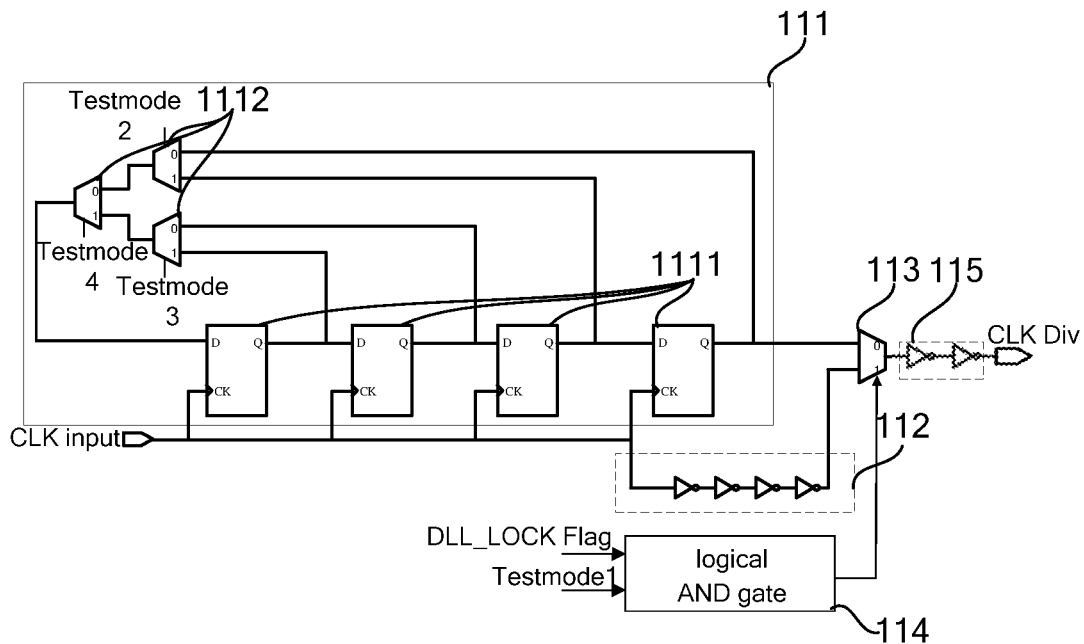
FIG. 2 is a schematic structural diagram of a first frequency divider in a delay-locked loop according to an implementation of the present disclosure.

Referring to FIG. 2, an output terminal of a previous flip-flop 1111 is connected to an input terminal of a latter flip-flop 1111, so as to connect the plurality of flip-flops 1111 in series, thereby transmitting a signal from the previous flip-flop 1111 to the latter flip-flop 1111 under the triggering of the input clock signal CLK input.

In addition, the plurality of second multiplexers 1112 are configured to lead an output terminal of each flip-flop 1111 to an input terminal of a first flip-flop 1111, so as to perform the frequency division on the input clock signal CLK input through circulation of the signal.

In practical application, different numbers of flip-flops 1111 and second multiplexers 1112 can be set according to the size of a frequency obtained by frequency division, for example, the size of the required first frequency and second frequency. For example, four flip-flops 1111 and three second multiplexers 1112 may be provided.

Two of the second multiplexers 1112 are provided with four input terminals to respectively access output terminals of the four flip-flops 1111, and output terminals of the two of the second multiplexers to access an input terminal of a third of the second multiplexer 1112. At the same time, an output terminal of the third of the second multiplexers 1112 accesses the input terminal of the first flip-flop 1111. The three second multiplexers 1112 are provided with control terminals to respectively access three second test signals. As shown in FIG. 2, the three second test signals are Testmode2, Testmode3, and Testmode4. Under the combination of the three different second test signals Testmode2, Testmode3, and Testmode4, the input clock signal CLK input is controlled to generate different frequency-divided clock signals CLK Div. For example, in FIG. 2, the frequency division unit 111 may generate a frequency-divided clock signal CLK Div of ½, ¼, ⅙, and ⅛ times the frequency of the input clock signal CLK input.

In practical application, the delay unit 112 may be formed in various ways, as long as the determined delay of the delay unit 112 is synchronized with the delay of the frequency division unit 111. For example, the delay unit 112 may include a plurality of inverters connected in series. When the inverters and the flip-flops 1111 are the same in delay, the number of the inverters is the same as the number of the flip-flops, so as to satisfy the requirement of delay synchronization. The specific structure of the delay unit 112 is not limited in the exemplary implementation of the present disclosure.

In the exemplary implementation of the present disclosure, the first frequency divider 110 further includes a driver 115, provided with an input terminal connected to an output terminal of the first multiplexer 113 and an output terminal for outputting the frequency-divided clock signal CLK Div. The driver 115 is mainly configured to enhance the strength of the frequency-divided clock signal CLK Div to be outputted.

It should be noted that the first frequency divider 110 used in the delay-locked loop of the embodiments of the present disclosure is not limited to the above structure.

In conclusion, in the delay-locked loop provided by the exemplary implementation of the present disclosure, by providing the primary path and the secondary path, in the locking process of the delay-locked loop, the first delay line can be adjusted only through the secondary path, so as to achieve the purpose of adjusting the delay. Moreover, a final signal is outputted through the primary path, so that the adjustment and the output can be set separately. According to the stage, the primary path can be turned off or the operating frequency of the secondary path can be reduced according to the situation, thereby reducing the current loss of the delay-locked loop to the greatest extent, and achieving the purpose of energy saving.

It should be noted that although the steps of the method in the present disclosure are described in the drawings in a particular sequence, it is not required or implied that the steps must be performed in that particular sequence or that all of the steps shown must be performed to achieve the desired results. Additionally or alternatively, some steps may be omitted, a plurality of steps may be combined into a single step for execution, and/or a single step may be divided into a plurality of steps for execution.

Figure 3:
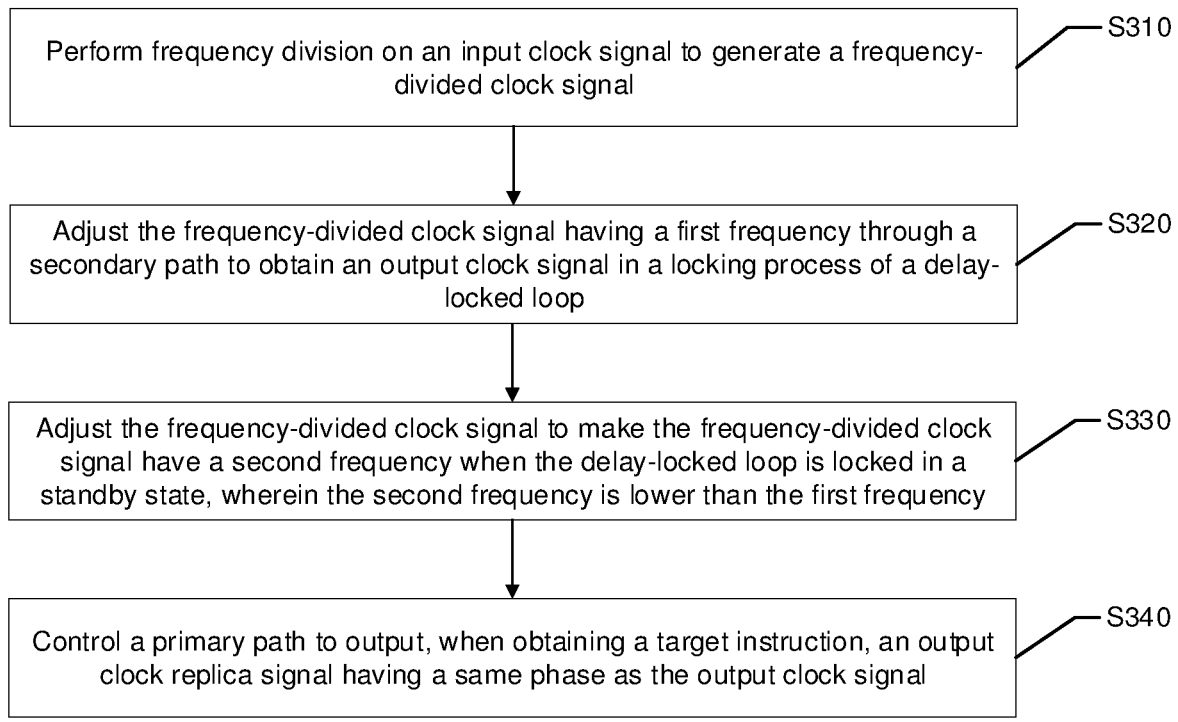
FIG. 3 is a flow diagram of steps of a control method for a delay-locked loop according to an implementation of the present disclosure.

In addition, a control method for a delay-locked loop is also provided in this exemplary embodiment. The control method for a delay-locked loop is used in the delay-locked loop. Referring to FIG. 3, the control method for a delay-locked loop includes the following steps:

step S310, perform frequency division on an input clock signal to generate a frequency-divided clock signal;

step S320, adjust the frequency-divided clock signal having a first frequency through the secondary path to obtain an output clock signal in a locking process of the delay-locked loop;

step S330, adjust the frequency-divided clock signal to make the frequency-divided clock signal have a second frequency when the delay-locked loop is locked in a standby state, wherein the second frequency is lower than the first frequency; and step S340, control the primary path to output, when obtaining a target instruction, an output clock replica signal having a same phase as the output clock signal.

The specific details of the control method for a delay-locked loop are described in detail in the corresponding delay-locked loop. Therefore, details are not described herein again.

An electronic device is also provided in the exemplary implementation of the present disclosure, and may include the delay-locked loop. The specific structure details of the delay-locked loop are described in detail in the foregoing implementation. Therefore, details are not described herein again.

The foregoing embodiments may be implemented in whole or in part by software, hardware, firmware, or any combination thereof. When a software program is used for implementation, the implementation can be performed in a form of a computer program product in whole or in part. The computer program product includes one or more computer instructions. When the computer program instructions are loaded and executed on a computer, the procedures or functions according to the embodiments of the present disclosure are all or partially generated. The computer may be a general-purpose computer, a dedicated computer, a computer network, or another programmable device. The computer instructions may be stored in a computer-readable storage medium, or may be transmitted from one computer-readable storage medium to another computer-readable storage medium. The computer-readable storage medium may be any usable medium accessible by a computer, or a data storage device, such as a server or a data center, integrating one or more usable media. The usable medium may be a magnetic medium (such as a floppy disk, a hard disk, or a magnetic tape), an optical medium (such as a DVD), a semiconductor medium (such as a solid state disk (SSD)), or the like. In the embodiments of the present disclosure, the computer may include the foregoing devices.

Although the present disclosure has been described in combination with the embodiments, those skilled in the art may understand and implement other changes of the embodiments of the present disclosure by checking the accompanying drawings, disclosures and appended claims during implementation of the present disclosure. In the claims, the word "comprising" does not exclude other components or step, and the word "a" or "an" does not exclude a plural cases. A single processor or other units may implement a plurality of functions listed in the claims. Some measures are recorded in dependent claims that are different from one another. However, it does not mean that these measure cannot be combined together to achieve a desirable effect.

Although the present disclosure has been described in combination with specific features and embodiments thereof, it is apparent that various modifications and combinations may be made without departing from the spirit and scope of the present disclosure. Correspondingly, the specification and accompanying drawings are merely exemplary descriptions of the present disclosure that are defined by the appended claims, and are deemed as covering any and all of the modifications, changes, combinations or equivalents within the scope of the present disclosure. Apparently, those skilled in the art can make various modifications and variations to the present disclosure without departing from the spirit and scope of the present disclosure. The present disclosure is intended to cover these modifications and variations provided that they fall within the scope of protection defined by the claims of the present disclosure or equivalents thereof.

The invention claimed is:

1. A delay-locked loop, comprising:
a secondary path configured to perform frequency division on an input clock signal to generate a frequency-divided clock signal, adjust the frequency-divided clock signal having a first frequency to obtain an output clock signal in a locking process of the delay-locked loop, and adjust the frequency-divided clock signal to make the frequency-divided clock signal have a second frequency when the delay-locked loop is locked in a standby state, wherein the second frequency is lower than the first frequency; and a primary path configured to output, when obtaining a target instruction, an output clock replica signal having a same phase as the output clock signal.

2. The delay-locked loop according to claim 1, wherein the secondary path comprises:
a first frequency divider configured to perform the frequency division on the input clock signal to generate the frequency-divided clock signal;
a first delay line configured to perform delay adjustment on the frequency-divided clock signal to obtain the output clock signal having a target phase;
a phase detector configured to obtain the output clock signal, compare the output clock signal with the input clock signal to determine a phase difference therebetween, generate a control signal according to the phase difference, and send the control signal to a delay line controller; and
the delay line controller configured to output a corresponding adjustment signal on the basis of the control signal to adjust a delay parameter of the first delay line.

3. The delay-locked loop according to claim 2, wherein the primary path comprises:
a second frequency divider having a same inherent delay as the first frequency divider; and
a second delay line configured to perform the delay adjustment on the frequency-divided clock signal by following the first delay line to obtain the output clock replica signal.

4. The delay-locked loop according to claim 3, wherein the secondary path further comprises a first clock output enable unit configured to transmit the output clock signal to the phase detector; and
the primary path further comprises a second clock output enable unit configured to control, when receiving the target instruction, an output terminal of the delay-locked loop to output the output clock replica signal.

5. The delay-locked loop according to claim 4, wherein an inherent delay of the first clock output enable unit is the same as an inherent delay of the second clock output enable unit.

6. The delay-locked loop according to claim 2, wherein the first frequency divider is configured to reduce a frequency of the frequency-divided clock signal from the first frequency to the second frequency after the first delay line is locked.

7. The delay-locked loop according to claim 6, wherein the first frequency divider comprises:
a frequency division unit configured to perform frequency division processing on the input clock signal;
a delay unit configured to compensate for a delay of the frequency division unit;
a first multiplexer provided with an input terminal configured to access an output terminal of the frequency division unit and an output terminal of the delay unit, and a control terminal configured to access an output terminal of a logical AND gate; and
the logical AND gate provided with an input terminal to access a delay-locked loop locking signal and a first test signal, and configured to control the first multiplexer to output an output signal of the delay unit when the delay-locked loop locking signal and the first test signal are enabled at the same time, and control the first multiplexer to output an output signal of the frequency division unit when the first test signal is not enabled.

8. The delay-locked loop according to claim 7, wherein the frequency division unit comprises a plurality of flip-flops sequentially connected in series, and a plurality of second multiplexers;
   an output terminal of a previous flip-flop is connected to an input terminal of a latter flip-flop; and
   the plurality of second multiplexers are configured to lead an output terminal of each flip-flop to an input terminal of a first flip-flop to perform the frequency division on the input clock signal.

9. The delay-locked loop according to claim 8, wherein there are four flip-flops and three second multiplexers;
   two of the second multiplexers are provided with four input terminals to respectively access output terminals of the four flip-flops, and output terminals of the two of the second multiplexers to access an input terminal of a third of the second multiplexer;
   an output terminal of the third of the second multiplexer accesses the input terminal of the first flip-flop; and
   the three second multiplexers are provided with control terminals to respectively access three second test signals, and configured to control the input clock signal to generate different frequency-divided clock signals under a combination of the three second test signals.

10. The delay-locked loop according to claim 8, wherein the delay unit comprises a plurality of inverters connected in series.

11. The delay-locked loop according to claim 10, wherein when the inverter and the flip-flop are delayed to a same extent, the number of the inverters is the same as the number of the flip-flops.

12. The delay-locked loop according to claim 7, wherein the first frequency divider further comprises a driver, provided with an input terminal connected to an output terminal of the first multiplexer and an output terminal for outputting the frequency-divided clock signal.

13. The delay-locked loop according to claim 3, wherein the second frequency divider has a same structure as the first frequency divider.

14. A control method for a delay-locked loop, wherein the delay-locked loop comprises a primary path and a secondary path; and the control method comprises:
   performing frequency division on an input clock signal to generate a frequency-divided clock signal;
   adjusting the frequency-divided clock signal having a first frequency through the secondary path to obtain an output clock signal in a locking process of the delay-locked loop;
   adjusting the frequency-divided clock signal to make the frequency-divided clock signal have a second frequency when the delay-locked loop is locked in a standby state, wherein the second frequency is lower than the first frequency; and
   controlling the primary path to output, when obtaining a target instruction, an output clock replica signal having a same phase as the output clock signal.

15. An electronic device, comprising the delay-locked loop according to claim 1.

* * * * *